(12) United States Patent
Higuchi

(10) Patent No.: US 7,423,479 B2
(45) Date of Patent: Sep. 9, 2008

(54) OFFSET CANCELLER FOR COMPENSATING FOR OFFSET IN SIGNAL OUTPUT

(75) Inventor: Koji Higuchi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 37 days.

(21) Appl. No.: 11/528,543

(22) Filed: Sep. 28, 2006

(65) Prior Publication Data
US 2007/0090873 A1   Apr. 26, 2007

(30) Foreign Application Priority Data
Oct. 21, 2005   (JP) ............................... 2005-306660

(51) Int. Cl.
*H03F 1/02* (2006.01)
(52) U.S. Cl. .................... 330/9; 330/253; 330/260; 327/307
(58) Field of Classification Search .............. 330/9, 330/253, 259–260
See application file for complete search history.

(56) References Cited

U.S. PATENT DOCUMENTS

| | | | |
|---|---|---|---|
| 6,118,395 A | * | 9/2000 | Kim ......................... 341/135 |
| 6,323,798 B1 | * | 11/2001 | Abe ........................... 341/150 |
| 6,448,836 B2 | | 9/2002 | Kokubun et al. |
| 6,762,643 B2 | * | 7/2004 | Milanesi ...................... 330/9 |
| 6,930,529 B2 | | 8/2005 | Tobita |
| 6,946,905 B2 | | 9/2005 | Kokubun et al. |
| 7,081,792 B2 | | 7/2006 | Kasai et al. |
| 2006/0244710 A1 | * | 11/2006 | Iriguchi et al. ............... 345/100 |

* cited by examiner

*Primary Examiner*—Robert Pascal
*Assistant Examiner*—Hieu Nguyen
(74) *Attorney, Agent, or Firm*—Studebaker & Brackett PC; Donald R. Studebaker

(57) ABSTRACT

An offset canceller outputs a signal during its offset compensating operation and compensates for the offset by capacitance or resistance devices connected externally to an operational amplifier. A driving circuit includes plural output circuits #1 to #n+1 for outputting driving signals to plural output terminals #1 to #n on one outputs and for outputting the driving signals on the other outputs coupled to corresponding plural output selectors #1 to #n, which then select one of two signals output from two neighboring output circuits to transmit the selected signals to the output terminals. The output circuits #1 to #n+1 have other outputs coupled to a decision circuit, which compares the signals to a reference voltage and outputs a decision signal representing the result of comparison at a predetermined timing. The output circuits execute the offset cancel operation responsive to the decision signal.

5 Claims, 3 Drawing Sheets

OFFSET CANCELLER FOR COMPENSATING FOR OFFSET IN SIGNAL OUTPUT

BACKGROUND OF THE INVENTION

1. Field of the Invention

The present invention relates to an offset canceller for canceling the offset in a signal output. More particularly, the present invention relates to an offset canceller applicable to an output circuit of a liquid crystal display device driver having a plurality of output operational amplifiers, as an example.

2. Description of the Background Art

An integrated circuit for driving a liquid crystal display (LCD) device, for example, includes a plural number of output operational amplifiers. In canceling the offset of those operational amplifiers, the routine practice is to cancel only the offset voltage, as disclosed in, for example, U.S. Pat. Nos. 6,946,905 B2, 6,448,836 B2 and 6,930,529 B2 to Kokubun et al., Kokubun et al., and Tobita, respectively.

However, if a capacitive or resistance device for setting the amplification factor is connected externally of the operational amplifiers, it is necessary to correct the offset, ascribable to the capacitance or resistance, with respect to the amplification factor. To such a case, the conventional offset canceller circuitry cannot be applicable.

Moreover, the conventional method for compensating for the offset suffers from the problem that no signal can be output during the operation of the offset compensation.

SUMMARY OF THE INVENTION

It is an object of the present invention to provide an offset canceller by means of which it is possible to output a signal in the course of the operation for offset compensation, and by means of which it is possible to compensate for the offset ascribable to the capacitance or resistance device externally connected to an operational amplifier.

The present invention provides an offset canceller including a plurality of output circuits for canceling an offset of an output signal and for outputting a resulting signal, a plurality of selectors for selecting an output of two output circuits of the plurality of output circuits, a plurality of output terminals for transmitting the output selected by the selectors, and a decision circuit operative in response to the output from the plurality of output circuits for verifying the state of offset. The plurality of output circuits are more by at least one than the plurality of selectors. One of the output circuits cancels out the offset, responsive to a decision of the decision circuit. The remaining output circuits transmit the output signal via the selectors to the output terminals.

Preferably, the output circuits includes a holding circuit for retaining the result of decision by the decision circuit, a differential amplifier for receiving an input signal on its one input terminal and for amplifying the input signal received, and a switching circuit connected to an output of the operational amplifier and turned on at the time of performing an offset cancel operation. Preferably, the differential amplifier includes a plurality of resistance value setting circuits, connected to the drain electrode of first and second differential transistors so that the resistance values as set on the resistance value setting circuit will be varied. Preferably, the output of the differential amplifier may be verified via the switching circuit by the decision circuit as the resistance values are progressively varied at the time of the offset cancel operation. Also preferably, the decision circuit compares an output of the output circuits to a predetermined reference voltage and transmits an output representative of the result of comparison.

The present invention also provides a method of canceling an offset of an output signal by an offset canceller. The method of the present invention is based upon an offset canceller which includes a plurality of output circuits for canceling an offset of an output signal and for outputting the resulting signal, a plurality of selectors for selecting an output of two output circuits of the plurality of output circuits, a plurality of output terminals for transmitting the output selected by the selectors, and a decision circuit for verifying the state of offset based on the output from the output circuits. The method includes the steps of providing the plurality of output circuits more by one than the plurality of selectors, canceling the offset in one of the plurality of output circuits, responsive to the decision of the decision circuit, and transmitting the output signal from the remaining ones of the output circuits via the selectors to the output terminal.

According to the present invention, offset cancellation may sequentially be carried out while the outputting operation of the output circuits is continued. It is thus possible to obtain a uniform output voltage at all of the output terminals. It is also possible to raise the accuracy of the offset cancellation further by using finer divisions of the capacitances used for gain adjustment.

Moreover, the voltage follower, used in an LCD source driver, may be compensated for offset without employing capacitive devices. In addition, the offset cancellation may be carried out more accurately by raising the accuracy of the comparator and by employing finer divisions of the resistances used for providing variable resistances. In addition, signals may be output during the offset cancel operations.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
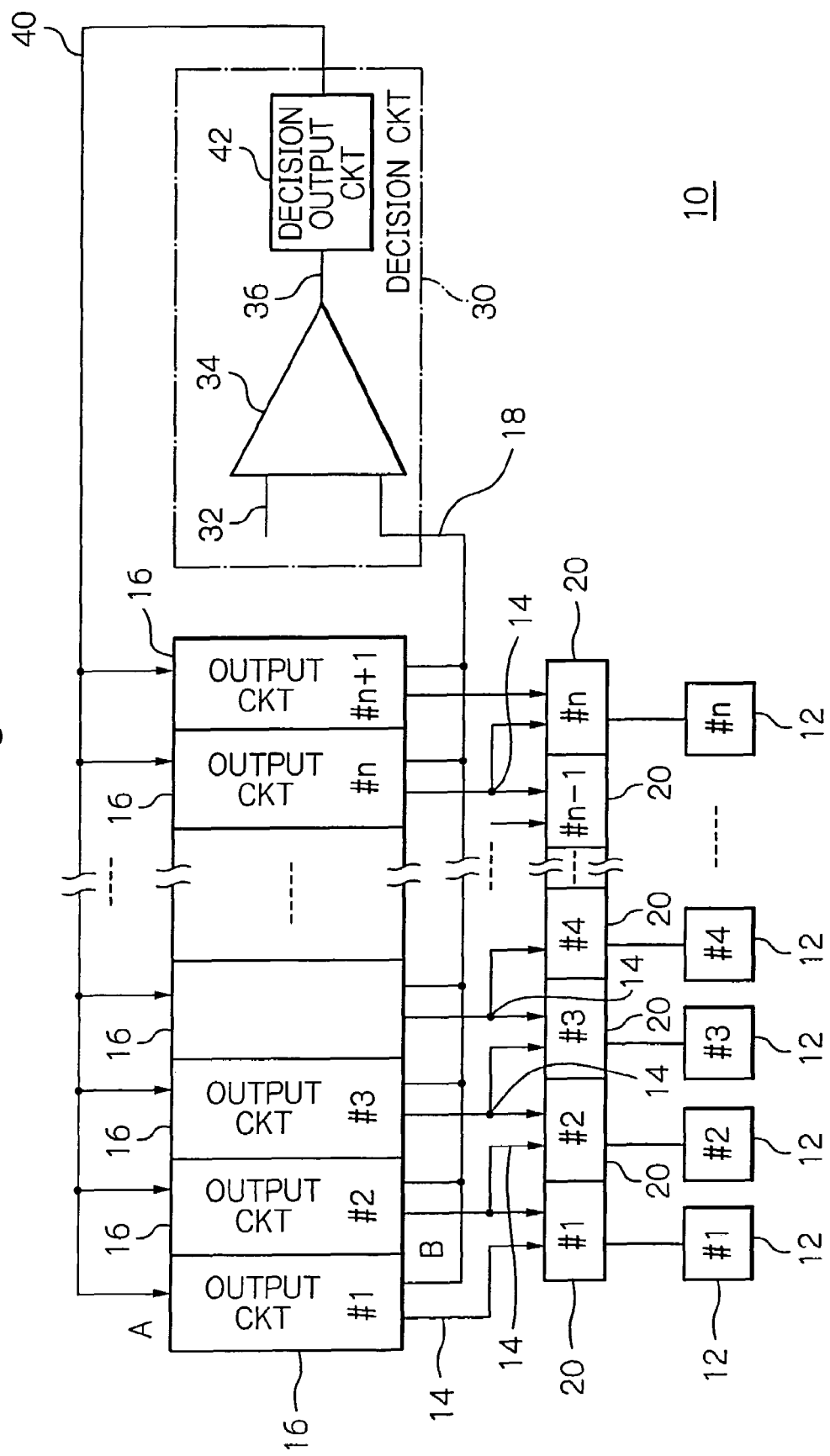
FIG. 1 is a schematic block diagram showing a preferred embodiment of a driver circuit according to the present invention.

A preferred embodiment of an offset canceller according to the present invention will now be described in detail with reference the accompanying drawings. In FIG. 1, there is shown an embodiment of a driving circuit to which applied is the offset canceller of the present invention. In the following description, components not directly relevant to understanding the present invention will not be shown nor described.

A driving circuit 10 of the present embodiment is a liquid crystal device driver circuit for driving a liquid crystal display (LCD) device, for example. The driving circuit 10 includes a plural number of output circuits (#1 to #n+1) 16 each having its one output14 adapted for outputting a driving signal to associated one of a plural number of output terminals (#1 to #n) 12, where n denotes natural numbers. The output circuits (#1 to #n+1) 16 each output a driving signal on its other output 18. The outputs 14 of the output circuits (#1 to #n+1) 16 are connected to a plural number of output selectors (#1 to #n) 20 as shown. Signals are designated by reference numerals of connections on which they appear.

The output selectors (#1 to #n) 20 each is adapted to select one of the signals 14 output from two neighboring ones of the output circuits 16 to output the so selected signal to the output terminals 12. More specifically, the output selector #n, for example, selects either the signal 14 from the output circuit #n (16) or the signal 14 from the output circuit #(n+1) (16). It should be noted that the number of the output circuits may be larger by two or more than the number of the output selectors 20. In this case, the output selectors 20 maybe adapted to variably select the relevant output circuits (#1 to #n+1) 16. To the output terminals 12 may be connected a liquid crystal display panel, for example. Meanwhile, the input terminals for input signals, entered to the output circuits (#1 to #n+1) 16, are not shown for avoiding the complicacy of the figures.

The other outputs 18 of the plural output circuits (#1 to #n+1) 16 are connected in common to a decision circuit 30. The decision circuit 30 is a comparator and determining circuit for receiving the signals 18 output from the output circuits 16 and for comparing the signal to a reference voltage. The decision circuit 30 includes a comparator 34 for comparing the reference voltage applied to its input 32 to a signal entered to the input 18, and a decision output circuit 42, connected to an output 36 of the comparator 34, and adapted for outputting a decision signal, matched to an output voltage of the comparator at an output 40, at a predetermined timing. The output 40 of the decision output circuit 42 forms an output of the decision circuit 30 and is connected to the plural output circuits 16 to constitute a feedback loop for feeding back the result of decision.

Figure 2:
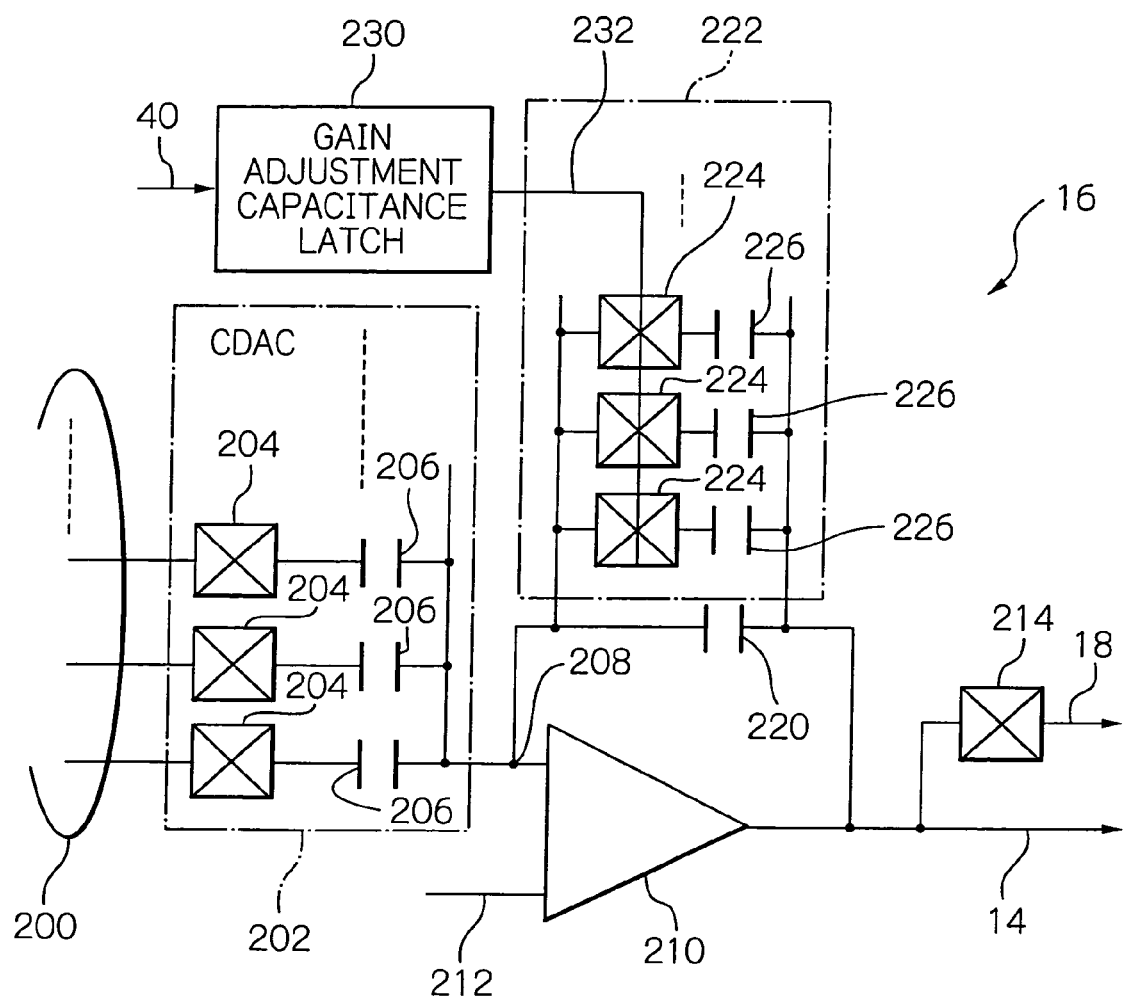
FIG. 2 is a schematic block diagram showing an illustrative constitution of an output circuit included in the embodiment shown in FIG. 1.

The inner constitution of the plural output circuits (#1 to #n+1) 16 will now be described in detail. FIG. 2 shows an illustrative constitution of one (#n) of the output circuits 16. The remaining output circuits (#1 to #n −1) 16 may be constituted similarly to the output circuit (#n) 16. The output circuit 16 includes its input port 200, receiving a digital signal, and a digital-to-analog converter 202, connected to the input port 200. In the instant embodiment, a capacitive digital-to-analog converter (CDAC) is applicable to the converter 202. The converter 203 has, for each bit position, an input switch 204 and a capacitive device 206 having its one terminal connected in series to the input switch 204 associated therewith. The capacitive devices-206 have the other terminal thereof interconnected in common to form an output 208 of the converter 202, which in turn connected to one input of an operational amplifier 210. The operational amplifier has its other input 212 supplied with a reference potential. The operational amplifier 210 transmits its output 14 corresponding to the potential difference between the potential on the input 208 and that on the input 212. The out put 14 is further connected to the output 18 via a switch 214.

The output 14 of the operational amplifier 210 is connected via a capacitive device 220 to the input 208 of the operational amplifier 210 in a feedback fashion. A capacitive circuit 222 is connected in parallel with the capacitive device 220. The capacitive circuit 222 is adapted for adjusting the gain of the operational amplifier 210. The capacitive circuit 222 includes a plural number of serial connections each of which is made up of a switch 224 and a capacitive device 226. Each switch 224 is turned on or off responsive to a switching signal 232 output from a gain adjustment capacitance latch 230 adapted for adjusting the capacitance of the capacitive circuit 222. The gain adjustment capacitance latch 230 receives and retains an output 40 of the decision circuit 30, FIG. 1, while turning the switch 224 on or off in response to the so retained output of the decision circuit 30. In this manner, the capacitive circuit 222 performs fine adjustment of the capacitance of the capacitive device 220, responsive to the output 40 of the decision circuit 30, in such a manner as to compensate for the offset.

The operation of the driving circuit 10, constructed as described above, will now be described. In the initial state, the switch 214 of the output circuit (#1) 16 is turned on, and the switches 214 of the other output circuits (#2 to #n+1) are all turned off. The output selector 20 connects the output circuit (#2) 16 to the output terminal (#1) 12, while connecting the output circuit (#3) 16 to the output terminal (#2) 12. The output selector operates in a similar sequence until it connects the output circuit (#n+1) 16 to the output terminal (#n), by way of on-off switching.

In this connection state, the offset cancel operation of the output circuit (#1) 16 will be carried out. First, the switches 224 in the capacitive circuit 222, FIG. 2, are all changed over to the off states thereof. An output of the operational amplifier 210 in this state is transmitted to the input to the decision circuit 30 via the switch 214. The comparator 34 compares a voltage appearing on its input 18 to the reference voltage 32 and transmits its output 36 representative of the result of comparison to the decision output circuit 42. The decision output circuit42 in turn transmits the result of decision at a preset timing to the output 40.

The output of the decision circuit 30 is transmitted to each of the output circuits 16. The output circuit (#1) 16 retains the output 40 of the decision circuit 30 in the gain adjustment capacitance latch 230. Upon storage of the output 40 of the decision circuit 30, the gain adjustment capacitance latch 230 causes one of the switches 224 of the capacitive circuit 222 to be turned on to store and retain the output 40 of the decision circuit 30 in this state. This sequence of operations is repeated in order. The offset cancel operation of the output circuit (#1) 16 comes to a close when the voltage appearing on the input 18 has become lower than the reference voltage 32.

When the offset cancel operation of the output circuit (#1) 16 has come to a close, the switch 214 of the output circuit (#1) 16 is turned off, and the switch 214 of the output circuit (#2) 16 is then turned on. Simultaneously, the output selector (#1) 20 disconnects the output circuit (#1) 16 from the output terminal (#1) 12 and connects the output circuit (#2) 16 to the output terminal (#2) 12. In this connection state, the offset cancel operation of the output circuit (#2) 16 is carried out in the same manner as described above.

In this manner, the offset compensation is carried out in each of the output circuits (#1 to #n+1) 16. When the offset cancel operation of the output circuit (#n+1) 16 has come to a close, the cancel operation of each of the output circuits (#1 to #n+1) 16 is repeated. It should be noted that, at the timings when the cancel operations are not being carried out, each output circuit 16 converts the input signal appearing on the input 200 into the analog signal 208, which is then amplified responsive to the capacitance defined by the capacitive device 220 and in the capacitive circuit 222.

In the illustrative embodiment of the present invention, described above with reference to FIGS. 1 and 2, the offset cancel operation may sequentially be carried out as the outputting operation of the output circuit 16 is carried out, such that a uniform output voltage may be obtained in all of the output terminals 12. For further raising the accuracy in the offset voltage cancellation, it is possible to use finer capacitance divisions of the capacitive device for gain adjustment 226.

Figure 3:
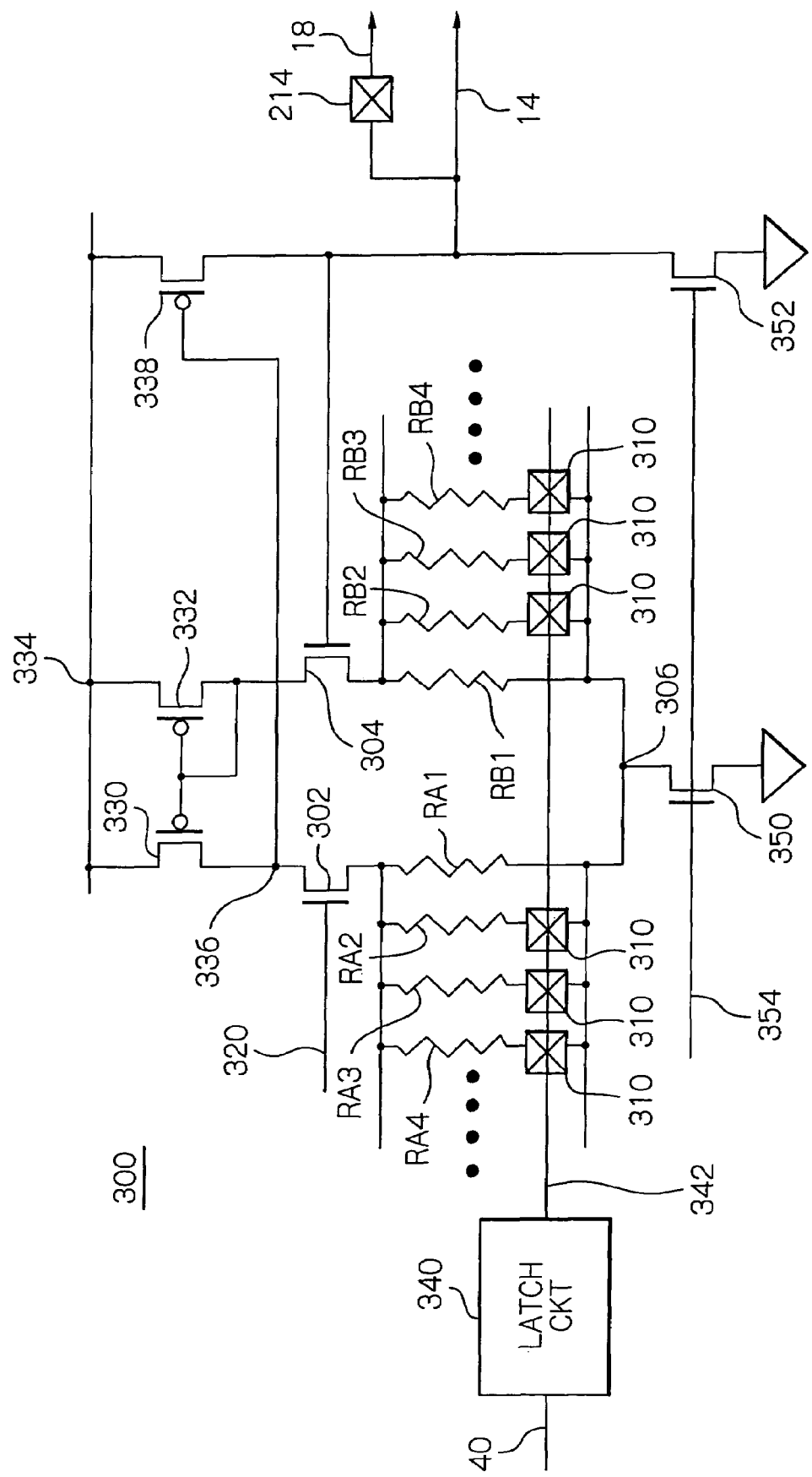
FIG. 3 is a schematic circuit diagram showing a modification of an output circuit.

An alternative embodiment of the driving circuit 10 will now be described. The driving circuit 10 of the alternative embodiment may be the same as the illustrative embodiment shown in and described with reference to FIG. 1 except that a plural number of output circuits 300 shown in FIG. 3 are provided in place of the output circuits 16 shown in FIG. 1. In other respects, the present alternative embodiment is similar to the above-described illustrative embodiment, and hence the corresponding description will be dispensed with. In the alternative embodiment, only an output circuit (#n), out of a plural number of the output circuits (#1 to #n+1) 300, will be described, and the remaining output circuit 300 may be the same in structure as the output circuit #n. The output circuit 300 includes an operational amplifier, in turn including differential transistors 302 and 304. Between the one differential transistor 302 and a junction point 306, a resistor RA1 is connected, and between the other differential transistor 304 and the junction point 306 another resistor RB1 is connected.

Between the differential transistor 302 and the junction point 306, also connected are plural sets of resister and switch, made up of resistors RA2, RA3, RA4, . . . and switches 310. In the similar manner, between the differential transistor 304 and the junction point 306, plural sets of resister and switch, made up of resistors RB2, RB3, RB4, . . . and switches 310 are also connected. The differential transistors 302 and 304 have the drain electrodes thereof connected via transistors 330 and 332, respectively, to a connection line 334. To the connection line 334 is applied a source voltage. A junction point 336 of the differential transistor 302 and the transistor 330 is connected to the gate electrode of the transistor 338, which has its drain electrode connected to the gate electrode of the differential transistor 304, the drain electrode thus forming the output 14 of the present output circuit 300. The output 14 is connected to the switch 214, which has its output 128 connected to the decision circuit 30 shown in FIG. 1.

The switches 310, connected to the plural resistors RA2, RA3, RA4, . . . and to the plural resistors RB2, RB3, RB4, . . . are turned on or off responsive to an output 342 of a latch circuit 340. The latch circuit 340 maybe configured similarly to the gain adjustment latch 230, shown in FIG. 2. More specifically, the latch circuit 230 retains a decision output signal, entered on its input 40, and turns the switches 310 on or off based on the value of the so retained signal. A transistor 350, connected to the junction point 306, and a transistor 352, connected to the drain electrode of the transistor 308, receive a bias 354, and constitute respective current sources.

The operation of the output circuit 300 of the present alternative embodiment will now be described. The output 40 of the decision circuit 30, shown in FIG. 1, is entered to the latch circuit 340. The latch circuit 340 controls the on and off, or enabling or disabling, of the switches 310, connected to the resistors RA2, RA3, RA4, . . . and to the resistors RB2, RB3, RB4.

The output 14 of the operational amplifier, provided in the output circuit 300, is entered to the gate electrode of the differential transistor 304, with the output circuit 300 operating as a voltage follower. Similarly to the switches 224, shown in FIG. 2, each switch 310 is controlled to be turned on or off in response to the value of the signal retained by the latch circuit 340.

The operation of the output circuit 300 will now be described. Initially, the internal switch 214 in the first-stage output circuit (#1) 300, equivalent to the output circuit (#1) 16 shown in FIG. 1, is turned on, while the switches 214 in the remaining output circuits (#2 to #n+1) are all turned off, as in the illustrative embodiment shown in FIG. 1. The output selectors 20 connect the output circuit (#2) 300 to the output terminal (#1) 12, while connecting the output circuit (#3) 300 to the output terminal (#2) 12, and so on until the output selectors 20 connect the output circuit (#n+1) to the output terminal (#n), as in the illustrative embodiment shown in FIG. 1, by way of on-off switching.

In this connection state, the offset cancel operation for the output circuit (#1) 300 will be carried out. Initially, the switches 310, connected to the resistors RA2, RA3, RA4, . . . are all turned on, while the switches 310, connected to the resistors RB2, RB3, RB4, . . . , are all turned off. In this state, an output signal is transmitted from the output circuit (#1) 300. Since the resistors RA2, RA3, RA4, . . . , are connected in parallel to each other, the combined resistance of the resistors RA2, RA3, RA4, . . . , is less than the resistance of the resistor RB1 connected to the differential transistor 304.

When the same amount of the current flows through the differential transistors 302 and 304, the voltage between the source electrode of the differential transistor 332 and the junction point 306 becomes larger than the voltage between the source electrode of the differential transistor 302 and the junction point 306. Thus, assuming that the gate voltages of the differential transistors 302 and 304 are substantially equal to each other, indicating that there is no offset, the output voltage of the output circuit 300 becomes stabilized at a value higher than the input voltage to the input 302. The decision circuit 30, FIG. 1, compares the output 18 in this state to the reference voltage 32. If the voltage at the output 18 is higher than the reference voltage 32, then the comparator 30 outputs the signal 40 indicative of the result of decision from the decision output circuit 42. This signal 40 is transmitted to each output circuit 300. The latch circuit 340 of the first output circuit (#1) 300 captures and retains the signal 40.

The resistor RA2 is then controlled to its off or non-conductive state to slightly lower the output voltage of the output circuit 300. The decision operation is then carried out in the same way as described above. When the decision operation, with the resistor RA2 turned off, has come to a close, the decision operation with the resistor RA3 in the off state is then carried out. The above operation is carried out in a similar manner repeatedly from the resistor RA4, et seq. When the switches 310 connected to the RA resistor sequence have all been turned off, the resistors of the RB resistor sequence, that is, RB2, RB3, . . . , are sequentially turned on. During the above sequence of operations, the output voltage of the output circuit 300 is progressively decreased. The offset cancel operation in the output circuit (#1) 300 comes to a close when the input voltage to the input 320 plus the offset voltage of the operational amplifier has become substantially equal to the output voltage at the output 14.

When the offset cancel operation in the output circuit (#1) 300 has come to a close, the internal switch 214 thereof is turned off, and the switch 214, provided in the next stage output circuit (#2), is turned on. The on and off switching in the output selector 20 is continued in the same way as in the above-described embodiment, such that the output of the output circuit (#1) 300 is connected to the output terminal (#1) 12. The offset cancel operations in the second and subsequent stage out put circuits (#2~#n+1) 300 are then carried out in order. When the offset cancel operation in the output circuit (#n+1) 300 has come to a close, the offset cancel operation is carried out aga in repeatedly from the output circuit (#1) 300, et seq.

With the alternative embodiment, described above, the offset voltage maybe compensated for, without using a capacitive device, even for the offset voltage of the voltage follower as used in an LCD device driver. The offset cancel operation may be achieved to a higher accuracy by raising the accuracy of the comparator and/or using finer divisions of the resistances of the resistors RA and RB.

The foregoing shows the illustrative configurations of operational amplifiers capable of carrying out offset cancel operations. It is noted that the configuration of the output circuit may also be applied to the comparator 34 shown for example in FIG. 1. Also, in the above-described embodiments, the output voltage is progressively changed in a decreasing direction during the offset cancel operations. Alternatively, a method of finding an optimum value by, for example, a binary research, may also be used.

The entire disclosure of Japanese patent application No. 2005-306660 filed on Oct. 21, 2005, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claim is:

1. An offset canceller comprising:
   a plurality of output circuits for canceling an offset of an output signal and for outputting a resulting signal;
   a plurality of selectors for selecting an output of two output circuits of said plurality of output circuits;
   a plurality of output terminals for transmitting the output selected by said plurality of selectors; and
   a decision circuit operative in response to an output from said plurality of output circuits for verifying a state of offset;
   said plurality of output circuits being provided more by at least one than said plurality of selectors;
   one of said plurality of output circuits being responsive to a decision of said decision circuit to cancel out the offset;
   remaining ones of said plurality of output circuits transmitting the output signal via said plurality of selectors to said plurality of output terminals.

2. The offset canceller in accordance with claim 1, wherein each of said plurality of output circuits includes:
   a holding circuit for retaining a result of decision by said decision circuit;
   an operational amplifier having one input terminal for receiving an input signal for amplifying the input signal received;
   a gain adjustment circuit connected to an output terminal and another input terminal of said operational amplifier for interconnecting the output terminal and the other input terminal of said operational amplifier by a capacitance which is variable in dependence upon a value retained by said holding circuit for adjusting a gain; and
   a switching circuit connected to the output terminal of said operational amplifier, said switching circuit being turned on at a time of an offset cancel operation;
   said switching circuit having an output terminal connected to said decision circuit.

3. The offset canceller in accordance with claim 1 wherein each of said plurality of output circuits includes:
   a holding circuit for retaining a result of decision by said decision circuit;
   a differential amplifier having one input terminal for receiving an input signal for amplifying the input signal received; and
   a switching circuit connected to the output terminal of said operational amplifier, said switching circuit being turned on at a time of an offset cancel operation;
   said differential amplifier including a plurality of resistance value setting circuits connected to a drain electrode of first and second differential transistors so as to render a resistance value variable;
   the resistance values being progressively varied at the time of the offset cancel operation to verify the output of said differential amplifier via said switching circuit by said decision circuit.

4. The offset canceller in accordance with claim 1 wherein said decision circuit compares an output of said plurality of output circuits to a predetermined reference voltage to transmit an output representative of a result of comparison to said plurality of output circuits.

5. A method for canceling an offset of an output signal by an offset canceller including:
   a plurality of output circuits for canceling the offset of the output signal and for outputting a resulting signal;
   a plurality of selectors for selecting an output of two output circuits of said plurality of output circuits;
   a plurality of output terminals for transmitting the output selected by said plurality of selectors; and
   a decision circuit operative in response to an output from said plurality of output circuits for verifying a state of offset;
   said method comprising the steps of:
   providing said plurality of output circuits more by one than said plurality of selectors;
   canceling the offset in one of said plurality of output circuits, responsive to a decision of said decision circuit; and
   transmitting the output signal from remaining ones of said plurality of output circuits via said plurality of selectors to said output terminal.

\* \* \* \* \*